(12) United States Patent
Huang

(10) Patent No.: US 8,188,361 B2
(45) Date of Patent: *May 29, 2012

(54) PHOTOVOLTAIC ELECTROCHROMIC DEVICE

(75) Inventor: Lee-May Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 577 days.

This patent is subject to a terminal disclaimer.

(21) Appl. No.: 12/406,965

(22) Filed: Mar. 19, 2009

(65) Prior Publication Data

US 2010/0000590 A1 Jan. 7, 2010

(30) Foreign Application Priority Data

Jul. 3, 2008 (TW) ................................ 97125127 A

(51) Int. Cl.
*G02F 1/153* (2006.01)
*H01L 31/00* (2006.01)
*H01L 31/042* (2006.01)
*G02F 1/15* (2006.01)

(52) U.S. Cl. ........ 136/244; 136/256; 136/263; 359/265; 359/267; 359/268; 359/275

(58) Field of Classification Search .......... 359/256, 359/267, 268, 275; 136/244, 256, 263
See application file for complete search history.

(56) References Cited

U.S. PATENT DOCUMENTS

| 4,583,122 A * | 4/1986 | Ohwada et al. ............... 348/792 |
| 5,377,037 A | 12/1994 | Branz et al. |
| 5,384,653 A | 1/1995 | Benson et al. |
| 5,592,074 A * | 1/1997 | Takehara ....................... 363/131 |
| 5,805,330 A | 9/1998 | Byker et al. |
| 5,888,431 A * | 3/1999 | Tonar et al. ..................... 252/583 |
| 6,118,572 A * | 9/2000 | Kostecki et al. ............... 359/265 |
| 6,606,183 B2 * | 8/2003 | Ikai et al. ........................ 359/265 |
| 2003/0140959 A1 * | 7/2003 | Gaudiana et al. ............. 136/244 |
| 2006/0225782 A1 * | 10/2006 | Berke et al. .................... 136/252 |

OTHER PUBLICATIONS

K.-S. Ahn, S.J. Yoo, M.-S. Kang, J.-W. Lee, Y.-E. Sung, "Tandem dye-sensitized solar cell-powered electrochromic devices for the photovoltaic-powered smart window", Journal of Power Sources 168 (Mar. 2007), p. 533-536.*

W. Gao, S.H. Lee, J. Bullock, Y. Xu, D.K. Benson, S. Morrison, H.M. Branz, "First a-SiC:H photovoltaic-powered monolithic tandem electrochromic smart window device", Solar Energy Materials and Solar Cells, 59, 1999, p. 243-254.*

* cited by examiner

*Primary Examiner* — Jennifer Michener
*Assistant Examiner* — Marla D McConnell
(74) *Attorney, Agent, or Firm* — Jianq Chyun IP Office

(57) ABSTRACT

A photovoltaic electrochromic device includes a semi-transparent thin-film solar cell substrate, an electrochromic solution, and a transparent non-conductive substrate, wherein the electrochromic solution is located between the transparent non-conductive substrate and the semi-transparent thin-film solar cell substrate. The semi-transparent thin-film solar cell substrate includes a transparent substrate and a plurality of thin-film solar cells, wherein the anodes and the cathodes of the thin-film solar cells are also used as the anodes and the cathodes of the photovoltaic electrochromic device. Because a driving voltage of the electrochromic solution is low, the thickness of an intrinsic layer in each of the thin-film solar cells can be thinned, which increases the transmittance of the photovoltaic electrochromic device. Besides, the current output of the photovoltaic electrochromic device can be controlled by an additional output switch layout coupled with the thin-film solar cells.

43 Claims, 10 Drawing Sheets

PHOTOVOLTAIC ELECTROCHROMIC DEVICE

CROSS-REFERENCE TO RELATED APPLICATION

This application claims the priority benefit of Taiwan application serial no. 97125127, filed on Jul. 3, 2008. The entirety of the above-mentioned patent application is hereby incorporated by reference herein and made a part of specification.

BACKGROUND OF THE INVENTION

1. Field of the Invention

The present invention relates to a photovoltaic electrochromic device.

2. Description of Related Art

What we call an electrochromic device is a device constituted of conductive materials for performing color changing when an electric field or current is applied to cause a reversible redox reaction. The fabrication of an electrochromic device should satisfy the following requirements: under different voltages, colors of the electrochromic device should be easily recognizable; the change of colors should be rapid and uniform; the reversibility of the color changing of the device should be repeatable for at least ten thousand times; and the device should have high stability. Commonly-used electrochromic devices are surface confined thin-film electrochromic devices and solution-type electrochromic devices.

A surface confined thin-film electrochromic device is formed by a top transparent substrate, a bottom transparent substrate, and an electrochromic multi-layer disposed therebetween. Specifically, the electrochromic multi-layer has a structure similar to a battery, which at least has five coated/deposited layers of different functions. The aforesaid five coated/deposited layers are a transparent conductive layer, an electrochromic layer, an electrolytic layer, an ion storage layer, and another transparent conductive layer. The solution-type electrochromic device has a simpler structure and is formed by a top transparent conductive layer and a bottom transparent conductive layer, which are bonded by an epoxy resin adhesive in a direction facing an electrode layer, and an electrochromic organic solution is disposed between the top and the bottom transparent conductive layers. The solution includes oxidation-type or reduction-type electrochromic organic molecules, a polymer electrolyte, and a solvent.

After years of research, only electrochromic rear-view mirrors have been commercialized. Other large-sized electrochromic devices 100 still face the problem of non-uniform color changing, which is also called an iris effect, as shown in FIG. 1. The explanation of the iris effect is based on FIG. 2. FIG. 2 illustrates a general electrochromic device 200, which is constituted of two transparent conductive substrates 210 and an electrochromic solution 220 disposed therebetween. When the electricity is provided from an electrode 230 disposed on the periphery of the two transparent conductive substrates 210, the difference in the path length of the electric fields in the center and the periphery of the plane electrochromic device 200, causes variation in the impedance; the difference in impedance is illustrated in FIG. 1. The gradual homocentric change of color concentration is displayed from the periphery to the center of the electrochromic device 200, which affects the uniformity of color changing.

To extend the application of electrochromic technology, researches that integrate photovoltaic technology have provided diverse directions for development. For instance, building integrated photovoltaic (BIPV) solar cells may be cooperated with the electrochromic technology to automatically adjust the colors of electrochromic windows to reduce indoor heat, based on indoor and outdoor illumination differences, which does not require any additional power supply. As power saving becomes more and more important, such an application has become a new trend.

For example, U.S. Pat. No. 5,377,037 has disclosed an electrochromic device which integrates silicon thin-film solar cells with electrochromic materials. In view of the structure thereof, silicon thin-film solar cells of a tandem structure, an electrochromic device, and an electrolytic layer are sequentially disposed between two transparent conductive glass substrates. Finally, bleed resistor are connected in series outside the two transparent conductive glass substrates of the tandem structure, so as to activate or deactivate the voltage which drives the electrochromic device when the silicon thin-film solar cells generate power. Although the double-side electrode structure can integrate the electrochromic device with solar cells, inorganic materials require greater charge density and larger voltage for performing color changing. Inevitably, the intrinsic layer needs to be thicker, so as to enhance the efficiency of photovoltaic conversion. Multi-junction stacked tandem cells may even be applied to increase the open circuit voltage (Voc) of the silicon thin-film solar cells. Consequently, the transmittance of the silicon thin-film solar cells is reduced.

SUMMARY OF THE INVENTION

The present invention provides a photovoltaic electrochromic device which furnishes uniform color changing and has higher transmittance.

The present invention provides a photovoltaic electrochromic device which includes a semi-transparent thin-film solar cell substrate, an electrochromic solution, and a transparent non-conductive substrate, wherein the electrochromic solution is disposed between the transparent non-conductive substrate and the semi-transparent thin-film solar cell substrate. The semi-transparent thin-film solar cell substrate includes a transparent substrate and a plurality of thin-film solar cells, wherein the anodes and cathodes of the thin-film solar cells also serve as an anode and a cathode of the photovoltaic electrochromic device.

The present invention further provides a photovoltaic electrochromic device which includes a semi-transparent thin-film solar cell substrate, an electrochromic solution, a transparent non-conductive substrate, and an output switch layout, wherein the electrochromic solution is disposed between the transparent non-conductive substrate and the semi-transparent thin-film solar cell substrate. The semi-transparent thin-film solar cell substrate includes a transparent substrate and a plurality of thin-film solar cells, wherein the anodes and cathodes of the thin-film solar cells also serve as an anode and a cathode of the photovoltaic electrochromic device. The output switch layout is coupled to the thin-film solar cells, so as to control a current output from the thin-film solar cells.

According to the present invention, the thin-film solar cells are, for example, distributed in array or in stripe on one substrate, so as to achieve uniform color changing. Moreover, in the present invention, the electrochromic solution requires lower redox voltage, and thus the demand for power generated by the thin-film solar cells is lowered. As a consequence, the thickness of the material of the solar cell thereof is reduced to increase the transmittance of the whole device.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
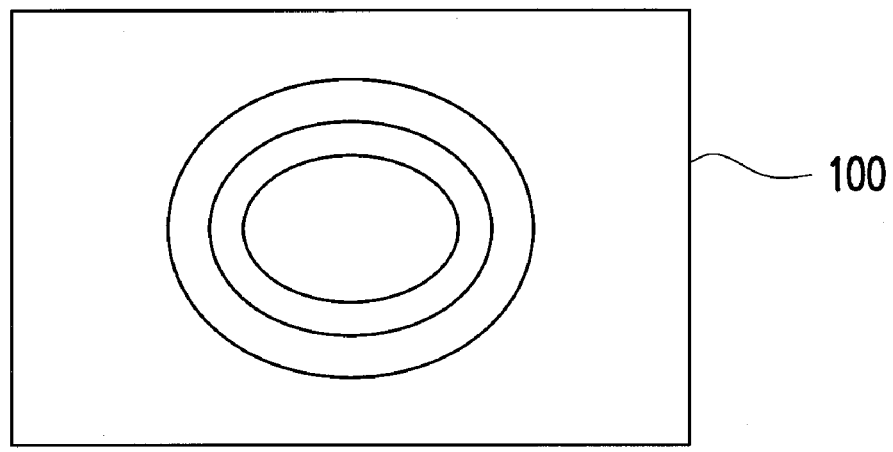
FIG. 1 is a schematic plane view of a conventional iris effect.
Figure 2:
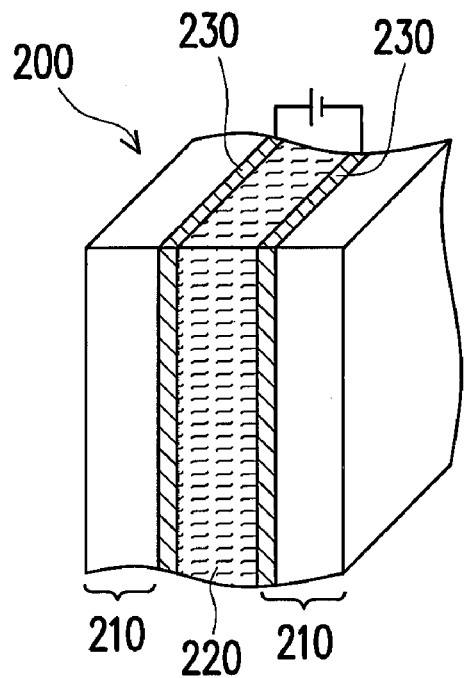
FIG. 2 is a schematic perspective view showing a structure of a conventional solution type electrochromic device.
Figure 3A:
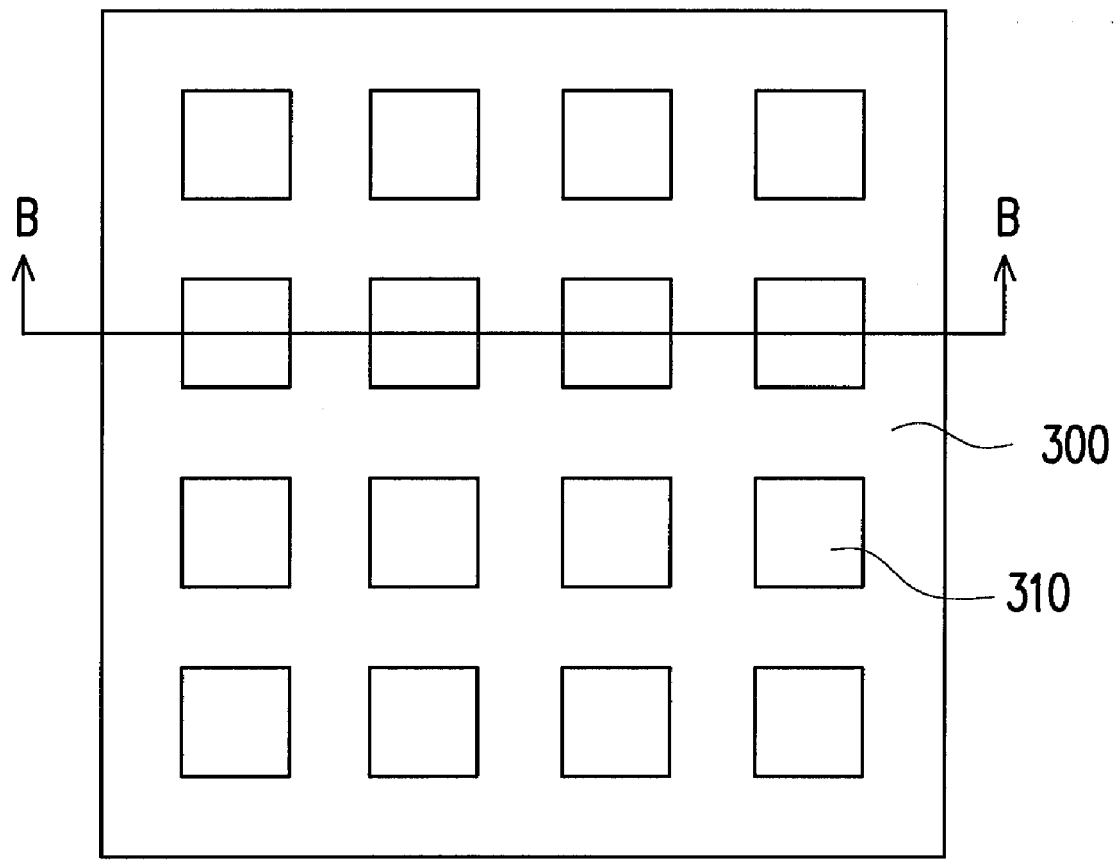
FIG. 3A is a schematic top view of a photovoltaic electrochromic device according to one embodiment of the present invention.
Figure 3B:
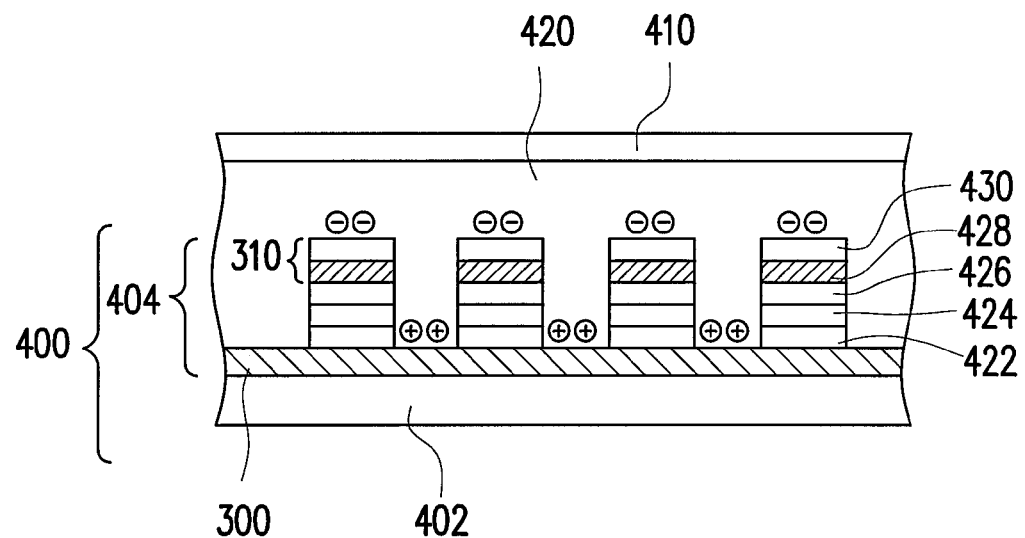
FIG. 3B is a schematic cross-sectional view along Line B-B in FIG. 3A.

FIG. 3A is a schematic top view of a photovoltaic electrochromic device according to the first embodiment of the present invention, and FIG. 3B illustrates a cross-sectional view thereof along Line B-B in FIG. 3A.

Referring to FIG. 3A and FIG. 3B, the photovoltaic electrochromic device in this embodiment is constituted of a semi-transparent thin-film solar cell substrate 400, a transparent non-conductive substrate 410, and an electrochromic solution 420. The electrochromic solution 420 is disposed between the semi-transparent thin-film solar cell substrate 400 and the transparent non-conductive substrate 410, so as to form a photovoltaic electrochromic device having a single-side conductive substrate. As shown in FIG. 3B, the semi-transparent thin-film solar cell substrate 400 has a superstrate structure and includes a transparent substrate 402 and a plurality of silicon thin-film solar cells 404, wherein a material of the transparent substrate 402 is glass, plastic, or other suitable transparent flexible substrates, for example. A material for forming the transparent non-conductive substrate 410 is, for instance, glass, plastic, or a flexible substrate. The silicon thin-film solar cells 404 are formed of an anode 300, a P-type layer 422, an intrinsic layer 424, an N-type layer 426, and a cathode 310, for example. Specifically, an anodic material of the anode 300 is, for instance, a transparent conductive oxide (TCO). The cathode 310 may include a transparent conductive oxide layer 428 and a metal layer 430, and the transparent conductive oxide layer 428 of the cathode 310 directly contacts the N-type layer 426.

Figure 3C:
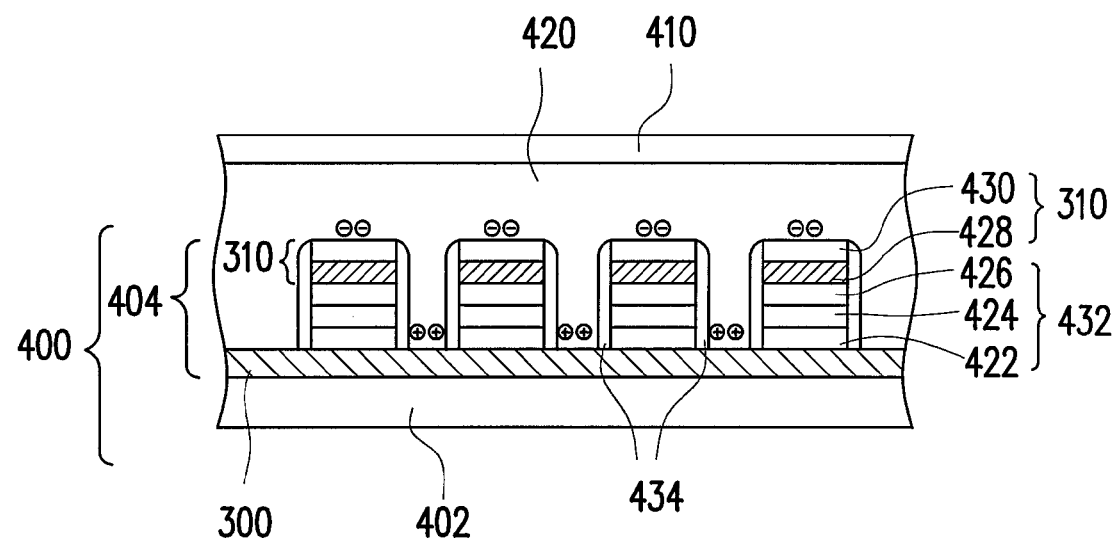
FIG. 3C is a schematic cross-sectional view of another variation of the photovoltaic electrochromic device in FIG. 3B.

FIG. 3C is a schematic cross-sectional view of another variation of the photovoltaic electrochromic device in FIG. 3B. As shown in FIG. 3C, the P-type layer 422, the intrinsic layer 424 and the N-type layer 426 are generally made of semiconductor material, and they are consisted of a semiconductor stacked layer 432. In FIG. 3C, the semi-transparent thin-film solar cell substrate 400 further includes passivation layers 434 respectively formed on the sidewalls of each semiconductor stacked layer 432 so as to protect the semiconductor stacked layer 432 from being affected by, for example, some electrochromic solutions which may be corrodible on the semiconductor stacked layer 432. For manufacturing convenience, the passivation layers 434 may be formed on the sidewalls of the cathode 310 and the semiconductor stacked layer 432 of each silicon thin-film solar cells 404.

In the first embodiment, the electrochromic solution 420 includes at least one redox-type organic molecule electrochromic material and at least one solvent, for example, so as to form a solution. Herein, the redox-type organic molecule electrochromic material is, for example, selected from one of a cathodic electrochromic material and an anodic electrochromic material, or a combination thereof. For instance, the aforesaid cathodic electrochromic material is one selected from the group consisting of methyl viologen, ethyl viologen, benzyl viologen, heptyl viologen, propyl viologen, derivatives thereof and a mixture thereof. The anodic electrochromic material is one selected from the group consisting of dimethylphenazine, N,N',N,N'-tetramethyl-p-phenylenediamine (TMPD), phenylene diamine, derivatives thereof and a mixture thereof, for example. Furthermore, the redox voltages thereof are both smaller than 3V Moreover, the electrochromic solution 420 may further includes an alkali metal salt, such as lithium triflate, lithium perchlorate, tetra alkyl ammonium salt, and so forth. In addition, a proper amount of a polymer, which is one selected from the group consisting of polyethylene oxide, polypropylene oxide, polymethylmethacrylate and a mixture thereof, and the polymer may be added into the electrochromic solution 420 to increase the viscosity thereof. The solvent in the electrochromic solution 420 may be propylene carbonate, ethylene carbonate, γ-butyrolactone, acetonitrile, tetrahydrofuran (THF), or N-methyl-2-pyrrolidone (NMP), for example.

Figure 4:
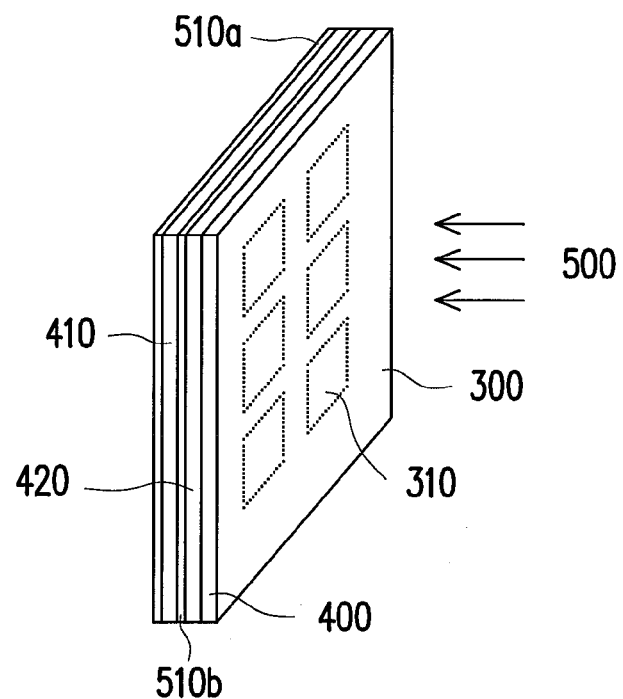
FIG. 4 is a schematic perspective view of the photovoltaic electrochromic device in FIG. 3B.

The anode 300 and the cathode 310 are not only used as the anodes and cathodes of the silicon thin-film solar cells 404 but also serve as the anode and cathode of the photovoltaic electrochromic device in this embodiment. FIG. 4 is a schematic perspective view of the photovoltaic electrochromic device in FIG. 3B. When sunlight 500 enters the photovoltaic electrochromic device through the semi-transparent thin-film solar cell substrate 400, the thin-film solar cells (refer to 404 in FIG. 3B) simultaneously generate electron-hole pairs. During the generation of electricity, current outputted from the thin-film solar cells is transmitted to the electrochromic solution 420 through the anode 300 and the cathode 310, which causes a redox reaction within the transparent and colorless electrochromic solution 420. At the same time, the constitution of the anode 300, the cathode 310, and the electrochromic solution 420 immediately functioning as electrochromic device. After the cathode 310 receives electrons released from the thin-film solar cells, reduction occurs and the color of the cathodic electrochromic material changes. After the anode 300 receives holes released from the thin-film solar cells, oxidization occurs and the color of the anodic electrochromic material changes. In addition, a reflective layer 510a or 510b maybe deposited on the transparent non-conductive substrate 410 to form a mirror surface; for example, a material of the reflective layer 510a or 510b includes one of silver and aluminum thin film coatings.

When the intensity of the sunlight declines, the electrons and holes generated by the thin-film solar cells are reduced and the current generates by the photovoltaic electrochromic device decreases gradually. The color of the cathodic electrochromic material on a surface of the cathode 310 gradually fades out and returns to the transparent and colorless oxidized state. The color of the anodic electrochromic material on a surface of the anode 300 also gradually fades out and returns the transparent and colorless reduced state. The electronic current generated by the thin-film solar cells is converted into an ionic current in the electrochromic solution 420. Thus, even though the anode 300 and the cathode 310 both contact the electrochromic solution 420 when conducted, the problem of short circuit would not occur. To maintain a charge balance in the redox reaction of the anode and the cathode during color changing, the area ratio of the anode 300 and the cathode 310 is preferably similar.

In this embodiment, the electrochromic solution 420 merely requires a low voltage and a low current to change color. For instance, 0.01M of methyl viologen dichloride and 0.1M of lithium. perchlorate are added and dissolved in 5 milliliter DI water first. After stirring, a well-mixed and colorless electrochromic solution is obtained. The aforesaid methyl viologen dichloride is 1,1'-dimethyl-4,4'-bipyridinium dichloride, which is represented by the following formula:

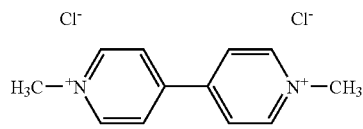

Figure 5:
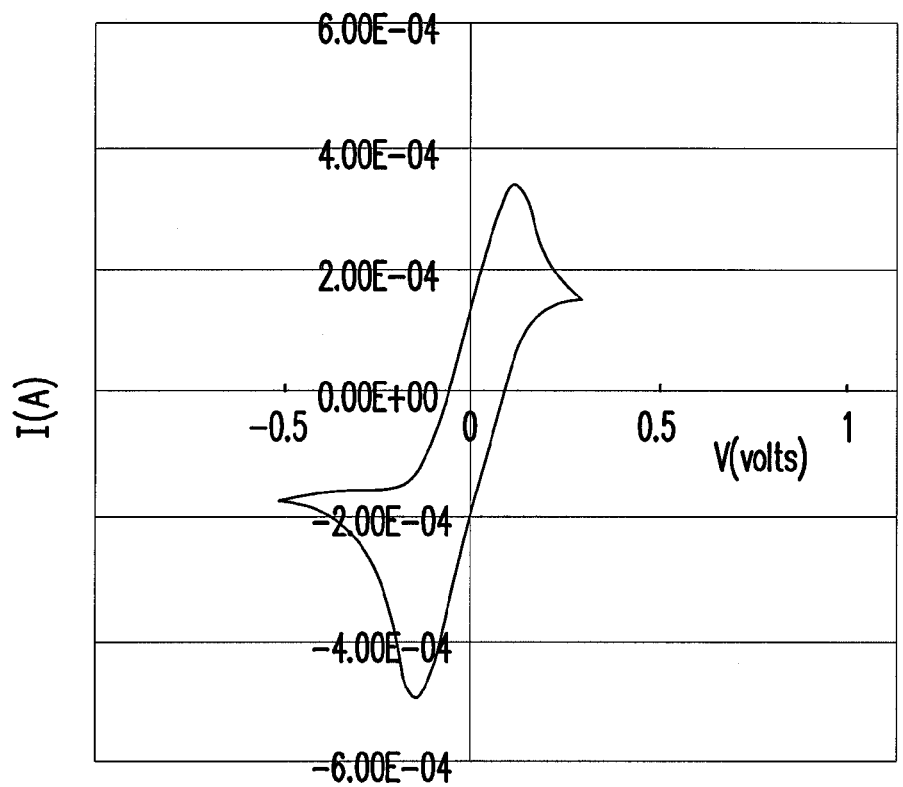
FIG. 5 is a curve diagram showing an electrochromic cyclic voltammogram of an electrochromic solution.

Next, the electrochromic solution is applied onto an indium-tin-oxide (ITO) conductive glass substrate of an area 2 cm×2 cm. Further, another indium-tin-oxide conductive glass substrate is added thereon to form an electrochromic device. An anode and a cathode of the electrochromic device are connected to an electrochemistry analyzer for performing a cyclic voltammogram (CV) scan from −1V to 3V. The scan result is shown in FIG. 5. General organic molecules require a fairly low redox voltage. Take the cathodic electrochromic material formed of viologen group as an example, an obvious color contrast is achieved when a charge density reaches 2 mC/cm$^2$.

With reference to FIG. 3B, because the redox voltage of the electrochromic solution 420 is low and the charge density required for color changing is not high, the transparent conductive oxide layer 428 is sufficient to serve as the cathode 310 when the thin-film solar cells 404 generate enough electricity for color changing. Moreover, the thickness of the intrinsic layer 424 can be reduced to increase the transmittance of the whole photovoltaic electrochromic device.

The following experimental examples are given to support the applicability of the photovoltaic electrochromic device in this embodiment.

EXPERIMENTAL EXAMPLE 1

A transparent glass substrate is first provided. Then, 0.1M of lithium perchlorate and 0.01M of methyl viologen (1,1'-dimethyl-4,4'-bipyridinium dichloride) are dissolved in 5 milliliter DI water and stirred to obtain a well-mixed transparent and colorless electrochromic solution. The electrochromic solution is applied to the aforesaid transparent glass substrate, and a semi-transparent thin-film solar cell substrate having an area of 15 cm×15 cm is attached onto the transparent glass substrate by an epoxy resin adhesive. Silicon thin-film solar cells are used in this example. The silicon thin-film solar cells are arranged in array, and one single array has an area of 0.25 cm$^2$. The epoxy resin adhesive has a thickness of around 0.15 centimeters and is mixed with glass beads which serve as spacers to maintain a distance between two substrates.

Figure 6:
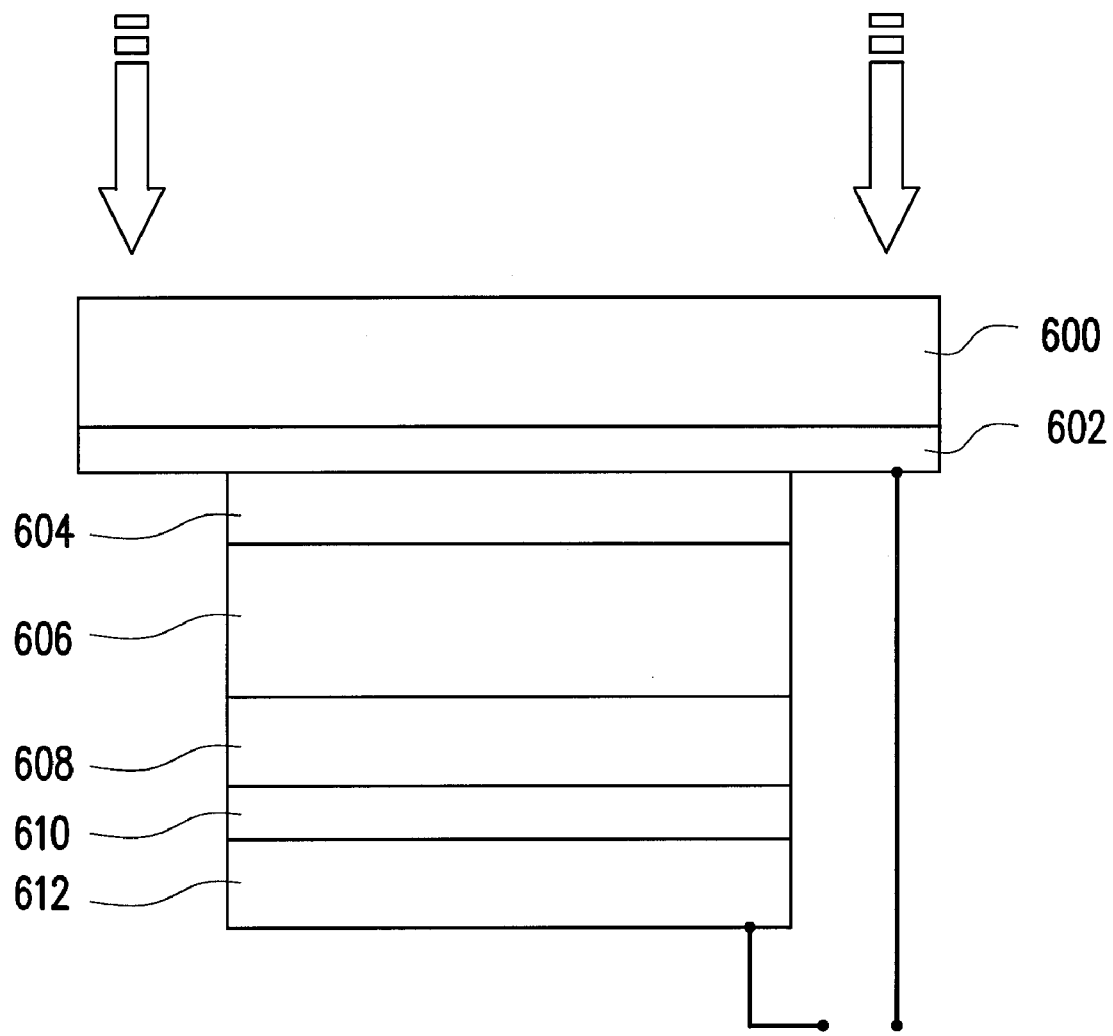
FIG. 6 is a schematic cross-sectional view of a semi-transparent thin-film solar cell substrate used in one of the embodiments.

To be more detailed, the semi-transparent thin-film solar cell substrate may be formed by a sputtering process, which is to grow a transparent conductive layer on a glass substrate of 15 cm×15 cm, follows by continuously depositing silicon thin films on the transparent conductive glass layer by a plasma enhanced chemical vapor deposition process, and finally a transparent conductive layer and a metal layer are sputtered on the silicon thin films. Thereafter, a pulse laser of 532 nm is used to remove a portion of the aforesaid silicon thin films, so as to form silicon thin-film solar cells arranged in array, wherein cathode blocks are silicon thin films each having an area of 0.5 cm×0.5 cm, and the areas outside the cathode blocks are anodic. Each of the cathode block is separated by a gap of 0.2 cm, and the total number of the cathode blocks is 196. As shown in FIG. 6, a structure thereof includes a glass substrate 600 having an area of 15×15 cm$^2$; a ZnO:Al layer 602 which serves as the anode and has a thickness of 10 nm; a P-type layer 604 having a thickness of 30 nm; an a-SiH layer 606 which serves as the intrinsic layer and has a thickness of 450 nm; an N-type layer 608 which has a thickness of 30 nm; and a ZnO:Al layer 610 of 80 nm thick and an Ag layer 612 of 300 nm thick which together constitute the cathode.

An open circuit voltage (Voc) of the semi-transparent thin-film solar cells is 0.6V. The current density Jsc is 5 mA/cm$^2$ and a Pmax is 0.5 mW. When sunlight irradiates upon the photovoltaic electrochromic device, the electrochromic solution right beneath the cathode starts to change color from transparent and colorless to light blue and then to deep blue within 30 seconds. When the sunlight is stopped, the photovoltaic electrochromic device restores transparency within 15 seconds.

EXPERIMENTAL EXAMPLE 2

A transparent glass substrate is first provided. Then, 0.1M of lithium perchlorate, 0.01M of 5,10-dihydro-5,10-dimethyl phenazine is dissolved into 5 milliliters of propylene carbonate solvent and stirred to obtain a well-mixed transparent and colorless electrochromic solution. The electrochromic solution is applied to the aforesaid transparent glass substrate, and a semi-transparent thin-film solar cell substrate having an area of 15 cm×15 cm is attached onto the transparent glass substrate by an epoxy resin adhesive. Silicon thin-film solar cells arranged in array are used in this experimental example. Each array has an area of 0.25 cm$^2$ and has a structure identical to the structure mentioned in experimental example 1. A thickness of the epoxy resin adhesive is about 0.15 centimeters and glass beads which serve as spacers are mixed thereinto, so as to maintain a distance between two substrates.

The open circuit voltage (Voc) of the semi-transparent thin-film solar cells is 0.62V. The current density Jsc is 5.2 mA/cm$^2$ and the Pmax is 0.55 mW. Accordingly, when sunlight irradiates upon the photovoltaic electrochromic device, the electrochromic solution right beneath the anode starts to change color from transparent and light yellow to yellow and then to green within 40 seconds. When the sunlight is stopped, the photovoltaic electrochromic device becomes transparent and light yellow within 20 seconds.

EXPERIMENTAL EXAMPLE 3

A transparent glass substrate having an area of 7.5 cm×7.5 cm is first provided, and then edges of the transparent glass substrate is pasted with solvent resistant tape which serve as spacers. Thereafter, 0.01M of Heptyl Viologen and 0.01M of TMPD are dissolved in propylene carbonate, and then 0.1M of TBABF$_4$ of electrolyte salt is added. After that, the above mixture is stirred to obtain a well-mixed transparent and colorless electrochromic solution. The electrochromic solution is applied to the aforesaid transparent glass substrate, and a semi-transparent thin-film solar cell substrate having an area of 7.5 cm×7.5 cm is attached onto the transparent glass substrate so as to constitute a photovoltaic electrochromic device.

Silicon thin-film solar cells arranged in stripe are used in this experimental example, wherein cathode blocks are silicon thin films each having an area of 5 cm×1 cm, and the areas outside the cathode blocks are anodic. Each of the cathode block is separated by a gap of 1 cm, and the total number of the cathode blocks is 3.

The open circuit voltage (Voc) of the semi-transparent thin-film solar cells is 0.64V. The current density Jsc is 5.7 mA/cm$^2$. Accordingly, when sunlight irradiates upon the photovoltaic electrochromic device, the electrochromic solution right beneath the anode and cathode start to change color from transparent to deep blue within 30 sec.

Figure 7A:
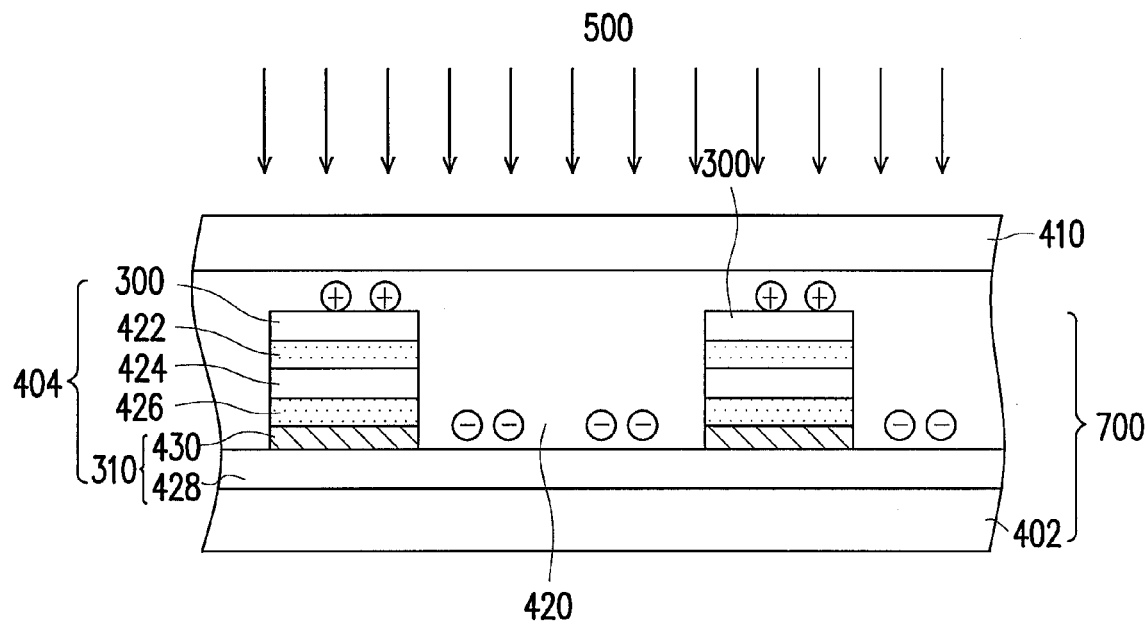
FIG. 7A is a schematic cross-sectional view of a photovoltaic electrochromic device according to the second embodiment of the present invention.

FIG. 7A is a schematic cross-sectional view of a photovoltaic electrochromic device according to the second embodiment of the present invention, in which identical elements are indicated by the same reference numbers as in the first embodiment. Referring to FIG. 7A, the photovoltaic electrochromic device in the second embodiment is constituted of a semi-transparent thin-film solar cell substrate 700, the electrochromic solution 420, and the transparent non-conductive substrate 410. The aforesaid semi-transparent thin-film solar cell substrate 700 has a substrate structure (i.e. the sunlight 500 enters through the transparent non-conductive substrate 410) and includes the silicon thin-film solar cells 404 and the transparent substrate 402. Further, the silicon thin-film solar cells 404 are formed of the cathode 310, the N-type layer 426, the intrinsic layer 424, the P-type layer 422, and the anode 300. Herein, the material for forming the anode 300 is, for example, a transparent conductive oxide (TCO). The cathode 310 may include a transparent conductive oxide layer 428 and a metal layer 430 disposed between the N-type layer 426 and the transparent conductive oxide layer 428. Because the semi-transparent thin-film solar cell substrate 700 has the substrate structure, the color changing of the electrochromic solution 420 may affect the conditions for the silicon thin-film solar cells 404 to generate electricity. For this reason, the photovoltaic electrochromic device in the second embodiment is applicable to devices which require cyclic color changing.

Figure 7B:
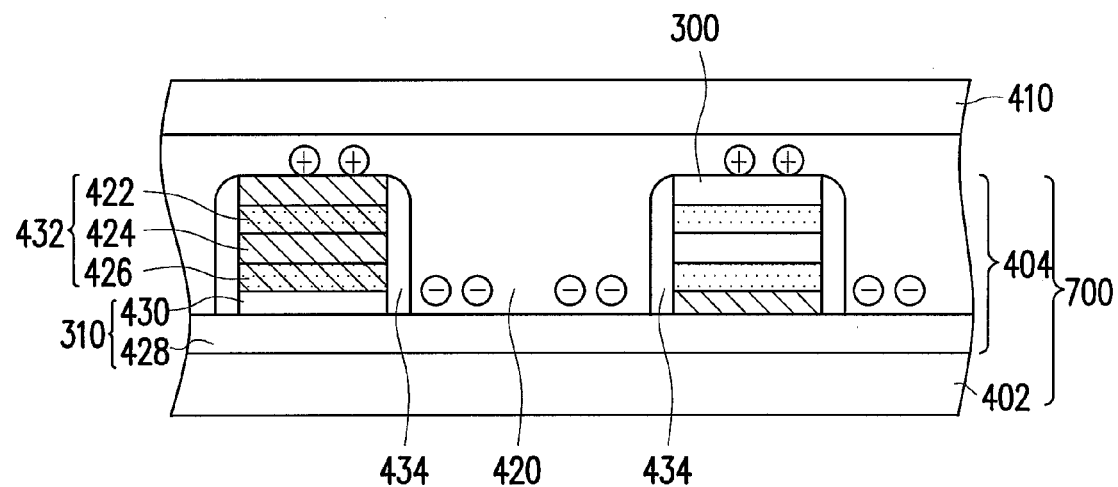
FIG. 7B is a schematic cross-sectional view of another variation of the photovoltaic electrochromic device in FIG. 7A.

FIG. 7B is a schematic cross-sectional view of another variation of the photovoltaic electrochromic device in FIG. 7A. As shown in FIG. 7B, the P-type layer 422, the intrinsic layer 424 and the N-type layer 426 are consisted of a semiconductor stacked layer 432, for example. Moreover, the semi-transparent thin-film solar cell substrate 700 further includes passivation layers 434 respectively formed on the sidewalls of each semiconductor stacked layer 432 to protect the semiconductor stacked layer 432 from being affected by some electrochromic solutions. In addition, the passivation layers 434 may be formed on the sidewalls of the anode 300, the metal layer 430 and the semiconductor stacked layer 432 of each silicon thin-film solar cells 404 for manufacturing convenience.

Figure 8A:
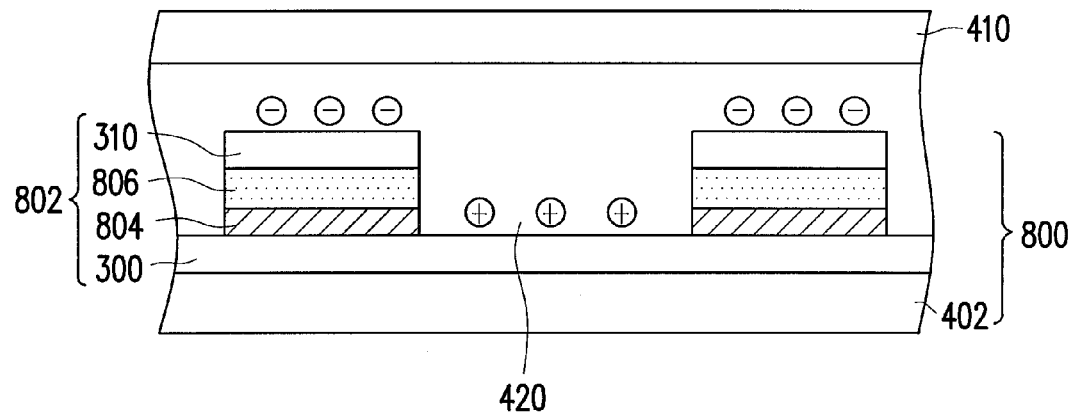
FIG. 8A is a schematic cross-sectional view of a photovoltaic electrochromic device according to the third embodiment of the present invention.

FIG. 8A is a schematic cross-sectional view of a photovoltaic electrochromic device according to the third embodiment of the present invention, in which identical elements indicated by reference numbers are the same as those in the second embodiment. With reference to FIG. 8, the main difference between the photovoltaic electrochromic devices in the second and the third embodiments lies in that a semi-transparent thin-film solar cell substrate 800 in the third embodiment includes the transparent substrate 402 and a plurality of CIGS thin-film solar cells 802, wherein the CIGS thin-film solar cells 802 are formed by the anode 300, a CIGS absorber layer 804, a buffer layer 806, and the cathode 310. A material of the anode 300 and the cathode 310 is a transparent conductive oxide (TCO), for example. Moreover, CdTe thin-film solar cells may also be used in the third embodiment.

Figure 8B:
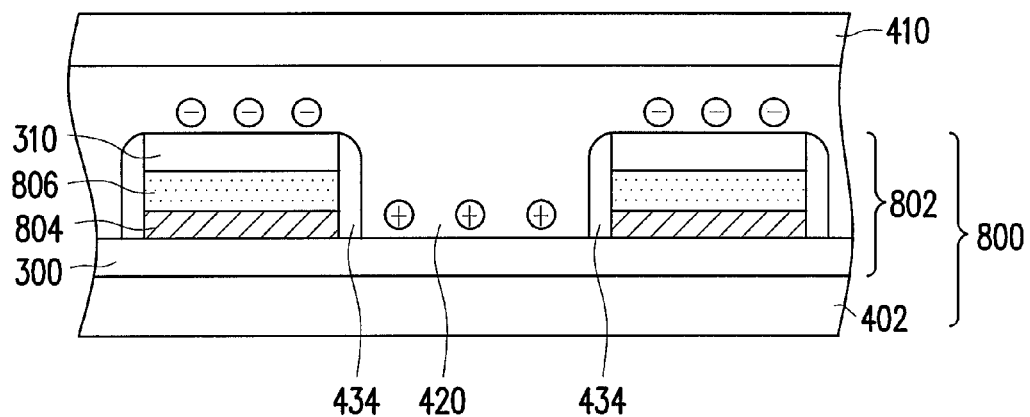
FIG. 8B is a schematic cross-sectional view of another variation of the photovoltaic electrochromic device in FIG. 8A.

FIG. 8B is a schematic cross-sectional view of another variation of the photovoltaic electrochromic device in FIG. 8A. As shown in FIG. 8B, the semi-transparent thin-film solar cell substrate 800 further includes passivation layers 434 respectively formed on the sidewalls of the CIGS absorber layer 804, the buffer layer 806 and the cathode 310. This passivation layers 434 at least have protective function to the CIGS absorber layer 804 and the buffer layer 806.

Figure 9:
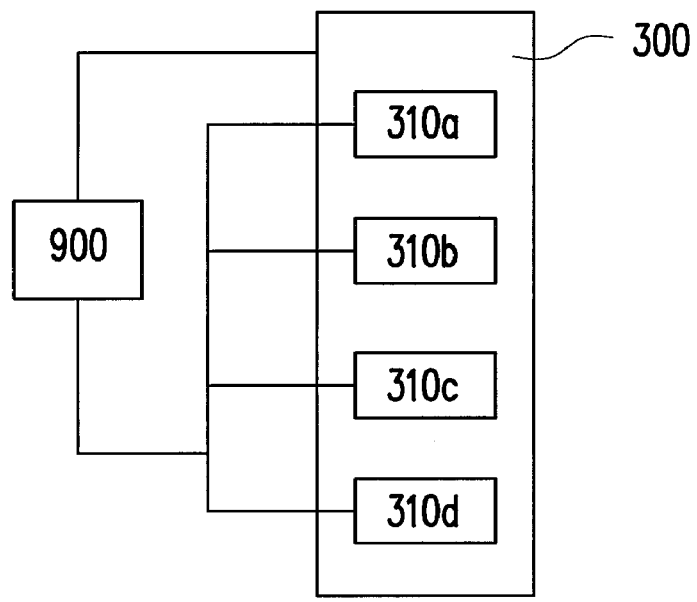
FIG. 9 is a block diagram of a photovoltaic electrochromic device according to the fourth embodiment of the present invention.

FIG. 9 is a block diagram of a photovoltaic electrochromic device according to the fourth embodiment of the present invention. With reference to FIG. 9, in addition to the semi-transparent thin-film solar cell substrate (ex. 400 in FIG. 4, 700 in FIGS. 7A-7B and 800 in FIGS. 8A-8B), the electrochromic solution (ex. 420 in FIG. 4), and the transparent non-conductive substrate (ex. 410 in FIG. 4) in the above embodiments, the photovoltaic electrochromic device in this embodiment further includes an output switch layout 900 connected to the thin-film solar cells (ex. 404 in FIG. 3B and 802 in FIG. 8A) for connecting the anode 300 with the cathode 310 to control a current output from the thin-film solar cells 404. Descriptions of the elements of the photovoltaic electrochromic device in this embodiment may be referred to in the above embodiments and therefore not repeated hereinafter.

FIG. 9 illustrates a parallel connection, wherein the anode 300 of the thin-film solar cells is a continuous film connected with the output switch layout 900. Further, the anode 300 and the cathodes 310a, 310b, 310c, and 310d which are arranged in stripe are respectively connected to the output switch layout 900.

Figure 10:
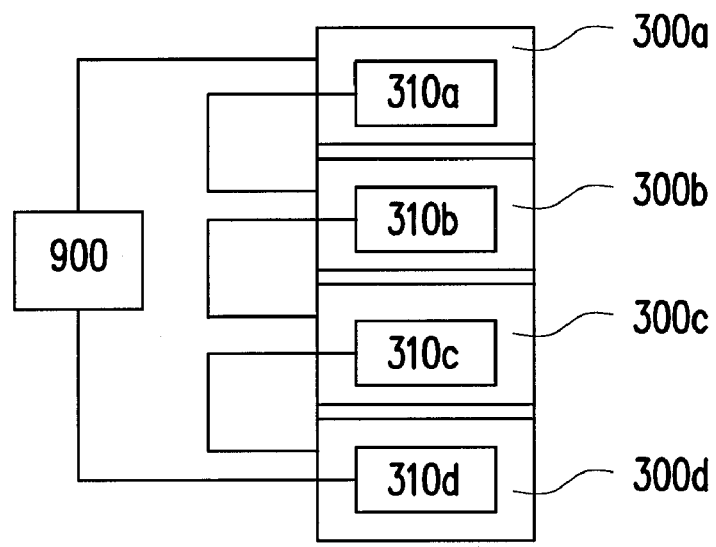
FIG. 10 is a block diagram of another variation of the photovoltaic electrochromic device in FIG. 9.

Besides the parallel connection in FIG. 9, the output switch layout 900 may also be connected in series as shown in FIG. 10, wherein the discontinuous anodes 300b, 300c, and 300d are connected with the cathodes 310a, 310b, and 310c of another thin-film solar cell, and the anode 300a and the cathode 310d are connected with the output switch layout 900.

The aforesaid output switch layout 900 may be fabricated based on technology that is currently available. For instance, FIG. 11 and FIG. 12 are diagrams respectively showing the circuits between the photovoltaic electrochromic device in FIG. 9 and different output switch layouts.

Figure 11:
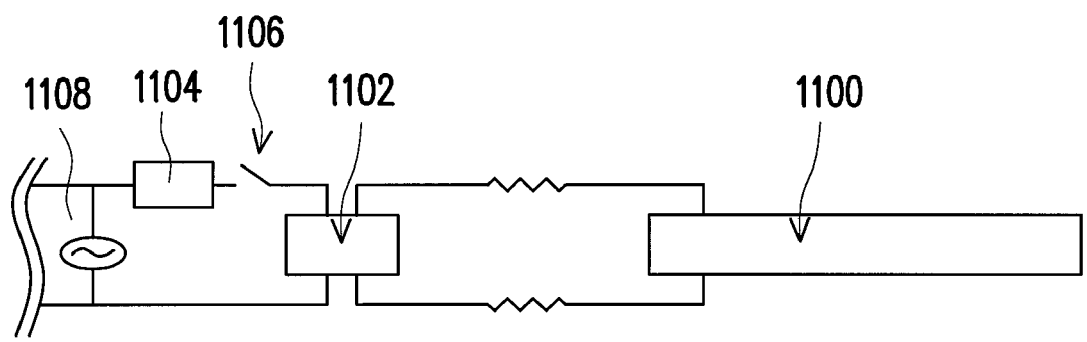
FIG. 11 is a diagram showing a circuit between the photovoltaic electrochromic device in FIG. 9 and an output switch layout.

Referring to FIG. 11, the reference number 1100 represents an electrochromic device of the photovoltaic electrochromic device in FIG. 9 (or FIG. 10). The electrochromic device 1100 and a thin-film solar cell 1102 are connected to a DC/AC inverter 1104. When a switch 1106 is connected, a current outputted by the thin-film solar cell 1102 is converted into general electricity 1108 (i.e. alternating current) for AC electric appliances.

Figure 12:
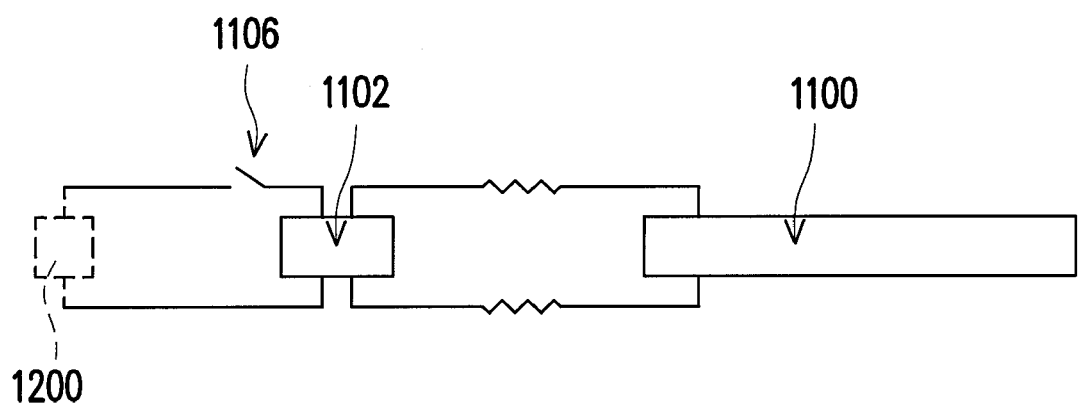
FIG. 12 is a diagram showing a circuit between the photovoltaic electrochromic device in FIG. 9 and another output switch layout.

Furthermore, referring to FIG. 12, the electrochromic device 1100 and the thin-film solar cell 1102 may be connected to a DC charge storage device 1200 (electricity storage device), so as to store a direct current generated by the thin-film solar cell 1102 for use of DC electrical appliances. When the switch 1106 is connected, the electrochromic device 1100 returns to colorless state.

Figure 13:
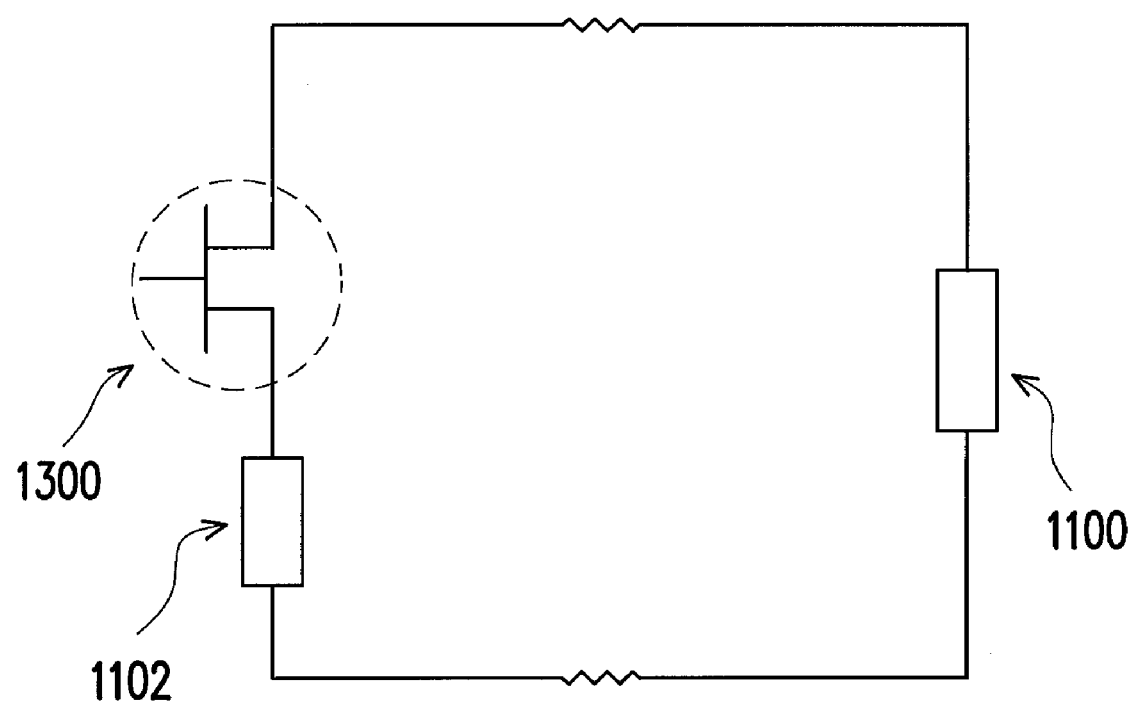
FIG. 13 is a diagram showing a circuit of the photovoltaic electrochromic device in FIG. 9 and a thin-film transistor.

In addition, the photovoltaic electrochromic device in FIG. 9 (or FIG. 10) may be combined with thin-film transistor (TFT) technology, wherein a thin-film transistor 1300 is disposed on the semi-transparent thin-film solar cell substrate, as shown in the circuit diagram of FIG. 13, so as to actively control the thin-film solar cell 1102 and manipulate the color changing of the electrochromic device 1100.

As above, the present invention has at least the following advantages:

In the present invention, the current generated by the photovoltaic electrochromic device is converted into an ion current in the electrochromic solution. Even though the anode and the cathode contact simultaneously when connected, short circuit would not occur.

The electrodes in the photovoltaic electrochromic device of the present invention are different from the conventional electrochromic device, in which electricity is supplied by periphery of the electrode. According to the present invention, the electrodes are evenly distributed in the whole semi-transparent thin-film solar cell substrate to create a uniform electric field. Therefore, the electrochromic solution in different areas still performs the same color change, and the iris effect is prevented.

In the present invention, redox-type organic molecule electrochromic material which has redox voltage smaller than 3V is adopted to form the photovoltaic electrochromic device. Accordingly, the photovoltaic electrochromic device can be driven with low voltage and low current. Furthermore, the thickness of the intrinsic layer of the thin-film solar cells is reduced, and merely the transparent conductive oxide layer is used as the electrode. As a consequence, the light transmittance of the device is increased, and the application of the device is extended to further reduce the production costs of the device.

The photovoltaic electrochromic device of the present invention may further include the output switch layout for connecting the DC/AC inverter and the DC charge storage device, so as to supply AC and DC electric appliances with the current generated by the device. It is one of the solutions to the problem of energy shortage.

Although the present invention has been disclosed by the above embodiments, they are not intended to limit the present invention. Persons having ordinary knowledge in the art may make some modifications and variations without departing from the spirit and scope of the present invention. Therefore, the protection sought by the present invention falls in the appended claims.

What is claimed is:

1. A photovoltaic electrochromic device, comprising:
a transparent non-conductive substrate;
a thin-film solar cell substrate, comprising a transparent substrate and a plurality of thin-film solar cells, wherein an anode and a cathode of each of the thin-film solar cells also serve as an anode and a cathode of the photovoltaic electrochromic device; and
an electrochromic solution disposed between the transparent non-conductive substrate and the thin-film solar cell substrate, wherein the electrochromic solution contacts with the anode and the cathode directly.

2. The photovoltaic electrochromic device as claimed in claim 1, wherein the thin-film solar cells are arranged in array or in stripe, or a combination thereof.

3. The photovoltaic electrochromic device as claimed in claim 1, wherein the electrochromic solution comprises at least one redox-type organic molecule electrochromic material and at least one solvent.

4. The photovoltaic electrochromic device as claimed in claim 3, wherein the redox-type organic molecule electrochromic material is a material selected from a material group comprising a cathodic electrochromic material and an anodic electrochromic material, or a combination thereof.

5. The photovoltaic electrochromic device as claimed in claim 4, wherein the cathodic electrochromic material is one selected from the group consisting of methyl viologen, ethyl viologen, benzyl viologen, heptyl viologen, propyl viologen, derivatives thereof and a mixture thereof.

6. The photovoltaic electrochromic device as claimed in claim 4, wherein the anodic electrochromic material is one selected from the group consisting of dimethylphenazine, N,N',N,N'-tetramethyl-p-phenylenedian, phenylene diamine, derivatives thereof and a mixture thereof.

7. The photovoltaic electrochromic device as claimed in claim 3, wherein the solvent comprises propylene carbonate, ethylene carbonate, γ-butyrolactone, acetonitrile, tetrahydrofuran, or N-methyl-2-pyrrolidone.

8. The photovoltaic electrochromic device as claimed in claim 3, wherein the electrochromic solution further comprises an alkali metal salt.

9. The photovoltaic electrochromic device as claimed in claim 8, wherein the alkali metal salt comprises lithium triflate, lithium perchlorate, or tetra alkyl ammonium salt.

10. The photovoltaic electrochromic device as claimed in claim 3, wherein the electrochromic solution further comprises a polymer.

11. The photovoltaic electrochromic device as claimed in claim 10, wherein the polymer is one selected from the group consisting of polyethylene oxide, polypropylene oxide, polymethylmethacrylate and a mixture thereof.

12. The photovoltaic electrochromic device as claimed in claim 1, wherein a redox voltage of the electrochromic solution is smaller than 3V.

13. The photovoltaic electrochromic device as claimed in claim 1, wherein the transparent non-conductive substrate comprises a glass, plastic or flexible substrate.

14. The photovoltaic electrochromic device as claimed in claim 1, wherein the transparent substrate of the thin-film solar cell substrate comprises a glass, plastic or flexible substrate.

15. The photovoltaic electrochromic device as claimed in claim 1, wherein the thin-film solar cell substrate has a superstrate structure or a substrate structure.

16. The photovoltaic electrochromic device as claimed in claim 1, wherein the thin-film solar cells comprise silicon thin-film solar cells, CIGS thin-film solar cells, or CdTe thin-film solar cells.

17. The photovoltaic electrochromic device as claimed in claim 1, wherein each of the thin-film solar cells comprises a semiconductor stacked layer between the anode and cathode and further comprises a plurality of passivation layers formed on a plurality of sidewalls of the semiconductor stacked layer.

18. The photovoltaic electrochromic device as claimed in claim 1, further comprising a reflective layer deposited on the transparent non-conductive substrate to form a mirror surface.

19. The photovoltaic electrochromic device as claimed in claim 18, wherein a material of the reflective layer comprises one of silver and aluminum thin film coatings.

20. The photovoltaic electrochromic device as claimed in claim 1, further comprising a plurality of thin-film transistors for actively controlling the thin-film solar cells.

21. A photovoltaic electrochromic device, comprising:
a transparent non-conductive substrate;
a thin-film solar cell substrate, comprising a transparent substrate and a plurality of thin-film solar cells, wherein the anodes and cathodes of the thin-film solar cells also serve as an anode and a cathode of the photovoltaic electrochromic device;
an output switch layout coupled to the thin-film solar cells for controlling a current output from the thin-film solar cells; and
an electrochromic solution disposed between the transparent non-conductive substrate and the thin-film solar cell substrate, wherein the electrochromic solution contacts with the anodes and the cathodes directly.

22. The photovoltaic electrochromic device as claimed in claim 21, wherein the thin-film solar cells are connected in parallel with the output switch layout.

23. The photovoltaic electrochromic device as claimed in claim 21, wherein the thin-film solar cells are connected in series with the output switch layout.

24. The photovoltaic electrochromic device as claimed in claim 21, wherein the output switch layout is further connected with a DC/AC inverter for converting a current provided by the thin-film solar cells into general electricity.

25. The photovoltaic electrochromic device as claimed in claim 21, wherein the output switch layout is further connected with a DC charge storage device for storing a direct current provided by the thin-film solar cells.

26. The photovoltaic electrochromic device as claimed in claim 21, wherein the electrochromic solution further comprises at least one redox-type organic molecule electrochromic material and at least one solvent.

27. The photovoltaic electrochromic device as claimed in claim 26, wherein the redox-type organic molecule electrochromic material is a material selected from a material group comprising a cathodic electrochromic material and an anodic electrochromic material, or a combination thereof.

28. The photovoltaic electrochromic device as claimed in claim 27, wherein the cathodic electrochromic material is one selected from the group consisting of methyl viologen, ethyl viologen, benzyl viologen, heptyl viologen, propyl viologen, derivatives thereof and a mixture thereof.

29. The photovoltaic electrochromic device as claimed in claim 27, wherein the anodic electrochromic material is one selected from the group consisting of dimethylphenazine, N,N',N,N'-tetramethyl-p-phenylenediamine, phenylene diamine, derivatives thereof and a mixture thereof.

30. The photovoltaic electrochromic device as claimed in claim 25, wherein the solvent comprises propylene carbonate, ethylene carbonate, γ-butyrolactone, acetonitrile, tetrahydrofuran, or N-methyl-2-pyrrolidone.

31. The photovoltaic electrochromic device as claimed in claim 26, wherein the electrochromic solution further comprises an alkali metal salt.

32. The photovoltaic electrochromic device as claimed in claim 31, wherein the alkali metal salt comprises lithium triflate, lithium perchlorate, or tetra alkyl ammonium salt.

33. The photovoltaic electrochromic device as claimed in claim 26, wherein the electrochromic solution further comprises a polymer.

34. The photovoltaic electrochromic device as claimed in claim 33, wherein the polymer is one selected from the group consisting of polyethylene oxide, polypropylene oxide, polymethylmethacrylate and a mixture thereof.

35. The photovoltaic electrochromic device as claimed in claim 21, wherein a redox voltage of the electrochromic solution is smaller than 3V.

36. The photovoltaic electrochromic device as claimed in claim 21, wherein the transparent non-conductive substrate comprises a glass, plastic or flexible substrate.

37. The photovoltaic electrochromic device as claimed in claim 21, wherein the transparent substrate of the thin-film solar cell substrate comprises a glass, plastic or flexible substrate.

38. The photovoltaic electrochromic device as claimed in claim 21, wherein the thin-film solar cell substrate has a superstrate structure or a substrate structure.

39. The photovoltaic electrochromic device as claimed in claim 21, wherein the thin-film solar cells comprise silicon thin-film solar cells, CIGS thin-film solar cells, or CdTe thin-film solar cells.

40. The photovoltaic electrochromic device as claimed in claim 21, wherein each of the thin-film solar cells comprises a semiconductor stacked layer between the anode and cathode and further comprises a plurality of passivation layers formed on a plurality of sidewalls of the semiconductor stacked layer.

41. The photovoltaic electrochromic device as claimed in claim 21, further comprising a reflective layer deposited on the transparent non-conductive substrate to form a mirror surface.

42. The photovoltaic electrochromic device as claimed in claim 41, wherein a material of the reflective layer comprises one of silver and aluminum thin film coatings.

43. The photovoltaic electrochromic device as claimed in claim 21, further comprising a plurality of thin-film transistors for actively controlling the thin-film solar cells.

* * * * *